United States Patent
Wu et al.

(10) Patent No.: US 9,760,024 B2
(45) Date of Patent: Sep. 12, 2017

(54) MASK DEVICE, EXPOSURE APPARATUS AND EXPOSURE METHOD

(71) Applicants: BOE TECHNOLOGY GROUP CO., LTD., Beijing (CN); Hefei BOE Optoelectronics Technology Co., Ltd., Hefei, Anhui (CN)

(72) Inventors: Bin Wu, Beijing (CN); Zhongxing Yu, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 14/912,801

(22) PCT Filed: Jul. 22, 2015

(86) PCT No.: PCT/CN2015/084813
§ 371 (c)(1),
(2) Date: Feb. 18, 2016

(87) PCT Pub. No.: WO2016/123922
PCT Pub. Date: Aug. 11, 2016

(65) Prior Publication Data
US 2016/0349630 A1    Dec. 1, 2016

(30) Foreign Application Priority Data
Feb. 4, 2015    (CN) .......................... 2015 1 0058241

(51) Int. Cl.
*G03B 27/62*    (2006.01)
*G03F 7/20*    (2006.01)
*G03F 1/50*    (2012.01)

(52) U.S. Cl.
CPC ............ *G03F 7/70733* (2013.01); *G03F 1/50* (2013.01); *G03F 7/20* (2013.01); *G03F 7/7035* (2013.01);
(Continued)

(58) Field of Classification Search
CPC .................................................. G03F 7/70733
(Continued)

(56) References Cited

U.S. PATENT DOCUMENTS

2003/0151731 A1*    8/2003    Hibbs ...................... G03F 1/64
355/75
2016/0070180 A1*    3/2016    Hwang ............... G03F 7/70733
355/75

FOREIGN PATENT DOCUMENTS

CN            1470940 A          1/2004
CN         101101452 A           1/2008
(Continued)

OTHER PUBLICATIONS

First Chinese Office Action and English translation dated Feb. 3, 2016, for corresponding Chinese Application No. 201510058241.6.
(Continued)

*Primary Examiner* — Hung Henry Nguyen
(74) *Attorney, Agent, or Firm* — Kinney & Lange, P.A.

(57) ABSTRACT

Embodiments of the present disclosure provide a mask device, an exposure apparatus and an exposure method, which enable a reduction in the possibility that the mask is scratched during exposure so as to protect the mask, and in turn a reduction in production cost of the semiconductor devices. The mask device comprises a mask carrier, a mask disposed on a lower surface of the mask carrier, and at least one protection unit provided on the mask carrier, wherein a lower end of the at least one protection unit is arranged to be lower than the lower surface of the mask during exposure.

(Continued)

The mask device is applicable in exposure of a substrate to be exposed.

17 Claims, 5 Drawing Sheets

(52) U.S. Cl.
CPC ...... *G03F 7/70716* (2013.01); *G03F 7/70866* (2013.01)

(58) Field of Classification Search
USPC .............................. 355/30, 72–75; 430/5, 30
See application file for complete search history.

(56) References Cited

FOREIGN PATENT DOCUMENTS

| | | | |
|---|---|---|---|
| CN | 102819187 | A | 12/2012 |
| CN | 102866588 | A | 1/2013 |
| CN | 104597723 | A | 5/2015 |
| EP | 0881538 | A2 | 12/1998 |
| EP | 1045288 | A2 | 10/2000 |
| JP | 2003177550 | A | 6/2003 |
| JP | 2009194147 | A | 8/2009 |
| KR | 20070018022 | A * | 2/2007 |
| WO | 2008054457 | A2 | 5/2008 |

OTHER PUBLICATIONS

International Search Report and Written Opinion (including English translation of Box V.) dated Oct. 19, 2015, for corresponding PCT Appln. No. PCT/CN2015/084813.

* cited by examiner

| moving exposure workbench in vertical direction to a position corresponding to preset exposure spacing, the lower end of the protection unit being arranged to be lower than the lower surface of the mask | — S101 |

| moving exposure worktable in horizontal direction so that a plurality of regions to be exposed of the substrate carried by exposure worktbench are moved in sequence to positions below the mask so as to be exposed | — S102 |

MASK DEVICE, EXPOSURE APPARATUS AND EXPOSURE METHOD

BACKGROUND OF THE INVENTION

Field of the Invention

Embodiments of the present disclosure generally relate to the field of semiconductor technologies, and particularly, to a mask device, an exposure apparatus and an exposure method.

Description of the Related Art

With continuous development of the semiconductor technologies, semiconductor devices such as liquid crystal display devices are widely applied.

Figure 1:
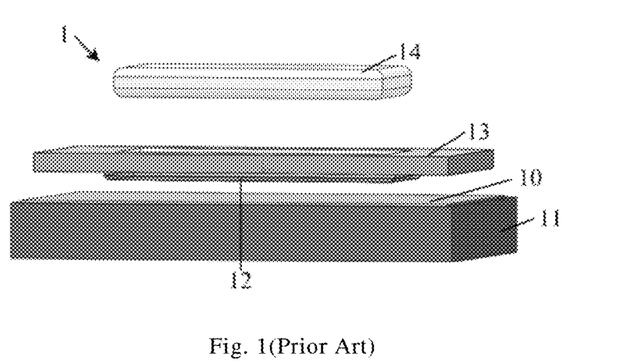
FIG. 1 is a structural schematic diagram of an exposure apparatus in prior arts.

Currently, process of manufacturing a semiconductor device such as a liquid crystal display device mainly includes coating, exposure, development and the like. FIG. 1 shows a structural schematic diagram of an existing exposure apparatus 1. A substrate 10 to be exposed is carried on an exposure workbench 11, and a mask 12 is vacuum adsorbed onto the mask carrier 13. During exposure performed by using the existing exposure apparatus 1, the mask 12 and an exposure light source 14 above the mask carrier 13 are generally kept stationary, and the substrate 10 is exposed by moving the exposure workbench 11.

However, an exposure spacing (a spacing between a lower surface of the mask 12 and an upper surface of the substrate 10 to be exposed) is generally very small, and the mask 12 will droop due to its gravity when being adsorbed on the lower surface of the mask carrier 13. Thus, if there is a foreign matter on a surface of the substrate 10 to be exposed, the mask 12 may be scratched by the foreign matter during exposure, resulting in a discard of the mask 12, which thereby increases a production cost of the semiconductor device such as the liquid crystal display device.

SUMMARY

Embodiments of the present disclosure provide a mask device, an exposure apparatus comprising the mask device, and an exposure method performed by using the exposure apparatus, which enable a great reduction in the possibility that the mask is scratched so as to protect the mask, and in turn a reduction of a production cost of the semiconductor devices such as the liquid crystal display device.

According to one aspect of the present disclosure, there is provided a mask device comprising a mask carrier and a mask disposed on a lower surface of the mask carrier, wherein the mask device further comprises at least one protection unit provided on the mask carrier, and wherein a lower end of the at least one protection unit is arranged to be lower than the lower surface of the mask during exposure.

In an embodiment, each said protection unit may comprise a lifter and a control module, the control module may be configured to control the lifter to move up or down in a vertical direction so as to adjust a spacing between the lower end and an upper surface of a substrate to be exposed so that the spacing between the lower end and the upper surface of the substrate to be exposed is smaller than a spacing between the lower surface of the mask and the upper surface of the substrate to be exposed.

In an embodiment, the control module may comprise a motor configured to drive the lifter to move up or down in the vertical direction.

In an embodiment, the control module may further comprise a photoelectric sensor, which may be configured to detect a spacing between the photoelectric sensor and the upper surface of the substrate to be exposed, which spacing is used to calculate the spacing between a lower end of the lifter and the upper surface of the substrate to be exposed, or the photoelectric sensor may be configured to detect the spacing between the lower end of the lifter and the upper surface of the substrate to be exposed, and the motor may be configured to drive the lifter to move up or down in the vertical direction according to the spacing between the lower end of the lifter and the upper surface of the substrate to be exposed, such that the lower end of the lifter is lower than the lower surface of the mask, and the lower end of the lifter is the lower end of the protection unit.

In an embodiment, the mask carrier may be provided with an opening, the protection unit is arranged within the opening, and the motor is fixed onto an inner wall of the opening.

In an embodiment, each control module may comprise two said motors which are disposed at two horizontal end sides of a corresponding lifter, respectively.

In an embodiment, the lifter may comprise a lifting carrier and a protrusion provided on a lower surface of the lifting carrier, and each said control module may comprise two said photoelectric sensors, which are provided on the lower surface of the lifting carrier and at two horizontal end sides of the protrusion respectively.

In an embodiment, a length of the protrusion in a first direction is larger than or equal to a length of the mask in the first direction, wherein the first direction is a direction along which a connection line between the two photoelectric sensors extends.

In an embodiment, the protrusion may have a wedge shape.

According to another aspect of the present disclosure, there is provided an exposure apparatus, comprising the mask device providing in any one of the above described embodiments and an exposure workbench configured to carry a substrate to be exposed.

In an embodiment, the exposure apparatus may further comprise a control system, each said protection unit may comprise a lifter having a lower end which is the lower end of the protection unit, a motor which may be configured to drive the lifter to move up or down in a vertical direction so as to adjust a spacing between the lower end of the lifter and an upper surface of the substrate to be exposed, and a photoelectric sensor which may be configured to detect a spacing between the photoelectric sensor and the upper surface of the substrate to be exposed, and the control system may be configured to calculate the spacing between the lower end of the lifter and the upper surface of the substrate to be exposed according to the spacing between the photoelectric sensor and the upper surface of the substrate to be exposed detected by the photoelectric sensor and a preset spacing between the photoelectric sensor and the lower end of the lifter, and to control the motor to drive the lifter to move in the vertical direction according to the calculated spacing between the lower end of the lifter and the upper surface of the substrate to be exposed, such that the lower end of the lifter is lower than the lower surface of the mask.

In an alternative embodiment, the exposure apparatus may further comprise a control system, each said protection unit may comprise a lifter having a lower end which is the lower end of the protection unit, a motor which may be configured to control the lifter to move up or down in a vertical direction so as to adjust a spacing between the lower end of the lifter and an upper surface of the substrate to be exposed, and a photoelectric sensor which may be configured to detect spacing between the lower end of the lifter and the upper surface of the substrate to be exposed, and the control system may be configured to control the motor to drive the lifter to move in the vertical direction according to the spacing between the lower end of the lifter and the upper surface of the substrate to be exposed detected by the photoelectric sensor, such that the lower end of the lifter is lower than the lower surface of the mask.

In an embodiment, the control system may further configured to control the motor to drive the lifter to move in the vertical direction when the spacing between the lower end of the lifter and the upper surface of the substrate to be exposed is smaller than or equal to 0, until the spacing between the lower end of the lifter and the upper surface of the substrate to be exposed is larger than 0.

In an embodiment, the control system may further configured to calculate a maximum drooping amount of the mask, calculate a spacing between the lower surface of the mask and the upper surface of the substrate to be exposed according to a preset exposure spacing between the lower surface of the mask and the upper surface of the substrate to be exposed and the maximum drooping amount of the mask, and control the motor to drive the lifter to move in the vertical direction when the spacing between the lower end of the lifter and the upper surface of the substrate to be exposed is larger than or equal to the spacing between the lower surface of the mask and the upper surface of the substrate to be exposed, until the spacing between the lower end of the lifter and the upper surface of the substrate to be exposed becomes smaller than the spacing between the lower surface of the mask and the upper surface of the substrate to be exposed.

According to a further aspect of the present disclosure, there is provided a method of exposing a substrate by using the exposure apparatus as described above, comprising:

moving the exposure workbench in a vertical direction to a position corresponding to a preset exposure spacing, which is a preset spacing between the lower surface of the mask and an upper surface of the substrate to be exposed, the lower end of the protection unit being arranged to be lower than the lower surface of the mask; and moving the exposure workbench in a horizontal direction so that a plurality of regions to be exposed of the substrate carried by the exposure workbench are moved in sequence to positions below the mask so as to be exposed.

In an embodiment, the method may further comprise: obtaining a spacing between the lower end of the protection unit and the upper surface of the substrate to be exposed; and controlling the protection unit to move in the vertical direction according to the obtained spacing between the lower end of the protection unit and the upper surface of the substrate to be exposed, such that the lower end of the protection unit is lower than the lower surface of the mask.

In an embodiment, each said protection unit may comprise a lifter having a lower end which is the lower end of the protection unit, a motor which may be configured to drive the lifter to move up or down in the vertical direction so as to adjust the spacing between the lower end and the upper surface of the substrate to be exposed, and a photoelectric sensor which may be configured to detect a spacing between the photoelectric sensor and the upper surface of the substrate to be exposed, and the method may further comprise:

detecting the spacing between the photoelectric sensor and the upper surface of the substrate to be exposed;

calculating the spacing between the lower end of the lifter and the upper surface of the substrate to be exposed according to the detected spacing between the photoelectric sensor and the upper surface of the substrate to be exposed detected and a preset spacing between the photoelectric sensor and the lower end of the lifter; and controlling the motor to drive the lifter to move in the vertical direction according to the calculated spacing between the lower end of the lifter and the upper surface of the substrate to be exposed, such that the lower end of the lifter is lower than the lower surface of the mask.

In an alternative embodiment, each said protection unit may comprise a lifter having a lower end which is the lower end of the protection unit, and a motor may be configured to drive the lifter to move up or down in the vertical direction so as to adjust the spacing between the lower end of the protection unit and the upper surface of the substrate to be exposed; and the method may further comprise: detecting the spacing between the lower end of the lifter and the upper surface of the substrate to be exposed; and controlling the motor to drive the lifter to move in the vertical direction according to the detected spacing between the lower end of the lifter and the upper surface of the substrate to be exposed, such that the lower end of the lifter is lower than the lower surface of the mask.

In an embodiment, the method may further comprise: controlling the motor to drive the lifter to move in the vertical direction when the spacing between the lower end of the lifter and the upper surface of the substrate to be exposed is smaller than or equal to 0, until the spacing between the lower end of the lifter and the upper surface of the substrate to be exposed is larger than 0.

In an embodiment, the method may further comprise: detecting a maximum drooping amount of the mask; calculating the spacing between the lower surface of the mask and the upper surface of the substrate to be exposed according to the preset exposure spacing and the maximum drooping amount of the mask; and controlling the motor to drive the lifter to move in the vertical direction when the spacing between the lower end of the lifter and the upper surface of the substrate to be exposed is larger than or equal to the spacing between the lower surface of the mask and the upper surface of the substrate to be exposed, until the spacing between the lower end of the lifter and the upper surface of the substrate to be exposed is smaller than the spacing between the lower surface of the mask and the upper surface of the substrate to be exposed.

With the mask device, the exposure apparatus comprising the mask device, and the exposure method performed by using the exposure apparatus, the mask carrier is provided with the protection unit, and the lower end of the protection unit is lower than the lower surface of the mask, or the spacing between the lower end of the protection unit and the upper surface of the substrate to be exposed is smaller than the spacing between the lower surface of the mask and the upper surface of the substrate to be exposed, that is, the lower end of the protection unit is lower than the entire lower surface of the mask. Thus, during exposure, if there is a foreign matter on the substrate to be exposed, the lower end of the protection unit will provide a barrier for the foreign matter so that the foreign matter cannot contact the mask, and consequently, the possibility that the mask is scratched by the foreign matter on substrate to be exposed can be greatly reduced during exposure, so that the mask is protected, thereby reducing a production cost of the semiconductor devices such as the liquid crystal display device.

DETAILED DESCRIPTION OF PREFERRED EMBODIMENTS OF THE INVENTION

The mask device, the exposure apparatus and the exposure method according to exemplary embodiments of the present disclosure will be described hereinafter in detail with reference to the attached drawings.

Further, in the following detailed description, for purposes of explanation, numerous specific details are set forth to provide a thorough understanding of the disclosed embodiments. It will be apparent that, however, one or more embodiments may be implemented without these specific details. In other instances, well-known structures and devices are schematically shown, or omitted to simplify the drawings.

It is noted that terms "upper", "lower" in following embodiments of the present disclosure are only intended to illustrate embodiments of the present disclosure with reference to the attached drawings, and are not used as restrictive terms.

Further, the terms "upper", "lower" in embodiments of the present disclosure are defined in accordance with an exposure direction, that is, an irradiation direction of light from an exposure light source. Light emitted from the exposure light source travels in the irradiation direction, a portion or a surface met by the light anteriorly is an "upper" portion or surface, while a portion or a surface met by the light posteriorly is a "lower" portion or surface. For example, a surface of the mask onto which the light emitted from the exposure light source is incident is called as an upper surface of the mask, while a surface of the mask from which the light is emitted is called as a lower surface of the mask.

Figure 2:
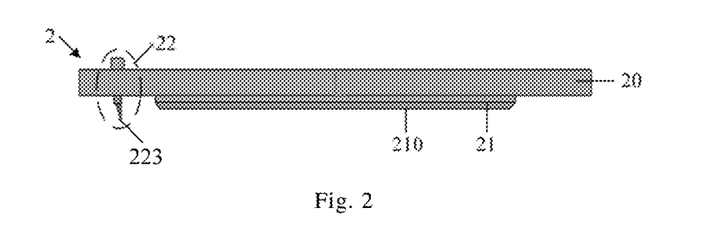
FIG. 2 is a structural schematic diagram of a mask device according to one exemplary embodiment of the present disclosure.

As shown in FIG. 2, an exemplary embodiment of the present disclosure provides a mask device 2, which may comprise a mask carrier 20 and a mask 21 disposed on a lower surface of the mask carrier 20. The mask device 2 may further comprise at least one protection unit 22 provided on the mask carrier 20, and the protection unit 22 is arranged so that a lower end 223 of the protection unit 22 is lower than the lower surface 210 of the mask 21 during exposure.

In the mask device according to the embodiment of the present disclosure, the mask carrier is provided with the protection unit, and the lower end of the protection unit is arranged to be lower than the lower surface of the mask, so that a spacing between the lower end of the protection unit and an upper surface of a substrate to be exposed is ensured to be smaller than a spacing between the lower surface of the mask and the upper surface of the substrate to be exposed, consequently the possibility that the mask is scratched by a foreign matter on the substrate to be exposed can be greatly reduced during exposure, and thereby the mask is protected and a production cost of the semiconductor devices such as the liquid crystal display device can be reduced.

Figure 9:
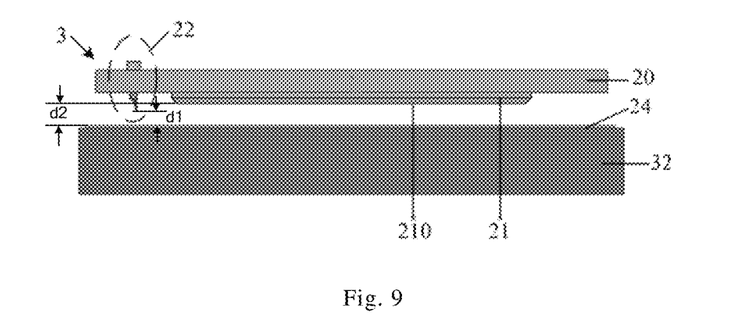
FIG. 9 is a structural schematic diagram of an exposure apparatus according to one exemplary embodiment of the present disclosure.

In the embodiment of the present disclosure, the spacing between the lower end of the protection unit (specifically, a lower end of a lifter of the protection unit, as described below) and the upper surface of the substrate to be exposed is a vertical distance d1 (specifically, as shown in FIG. 9) between the lower end of the protection unit and the upper surface of the substrate to be exposed; the spacing between the lower surface of the mask and the upper surface of the substrate to be exposed is a vertical distance d2 (specifically, as shown in FIG. 9) between the lower surface of the mask and the upper surface of the substrate to be exposed.

It is noted that in embodiments of the present disclosure, there may be one or more the protection units provided on the mask carrier, which is not particularly limited in the present disclosure.

In embodiments of the present disclosure, the protection unit may be connected onto the mask carrier or provided at a suitable position on the mask carrier. For example, the protection unit may be provided on an upper surface, a lower surface, or a side face of the mask carrier, which is not particularly limited in the present disclosure.

In one example of the mask device 2 according to embodiments of the present disclosure, the mask 21 is arranged on the mask carrier 20, and the protection unit 22 may be arranged at a position on the mask carrier 20 such that it is not coincident with the mask 21, that is, the protection unit 22 and the mask 21 are arranged at different positions on the mask carrier 20 such that they do not interfere with each other.

Preferably, in embodiments of the present disclosure, the mask carrier may be provided with four protection units, and the four protection units may be provided on four side faces of the mask carrier respectively, so that it can be ensured that the entire mask will not be scratched by the foreign matter on the substrate to be exposed, thereby the mask is protected and the production cost of semiconductor devices is reduced.

In embodiments of the present disclosure, the protection unit 22 may be provided on the mask carrier 20 in any fixed way such as by using a bolt, a rivet, an adhesive or the like, which is not particularly limited in the present disclosure.

Figure 3:
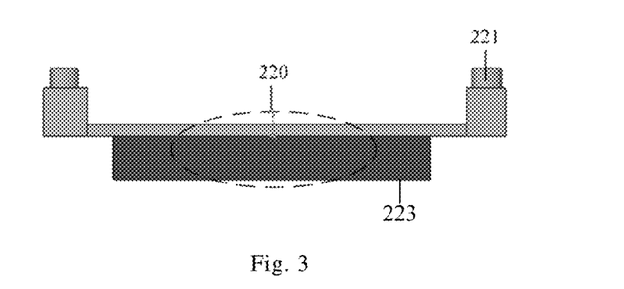
FIG. 3 is a schematic cross-sectional view of a protection unit according to one exemplary embodiment of the present disclosure.

FIG. 3 is a schematic cross-sectional view of a protection unit 22 according to one exemplary embodiment of the present disclosure. Each said protection unit 22 comprises a lifter 220 and a control module configured to control the lifter 220 to move up or down in a vertical direction. The control module may be configured to control the lifter 220 to move up or down in the vertical direction so as to adjust the spacing between the lower end 223 of the protection unit 22 and the upper surface of the substrate to be exposed. On one hand, the lower end of the protection unit 22 is caused to move up in the vertical direction once contacting the substrate to be exposed, so that the substrate to be exposed is prevented from being scratched by the lower end of the protection unit 22; on the other hand, the lower end of the protection unit 22 is caused to move up once contacting a foreign matter on the substrate to be exposed, so that the foreign matter on the substrate to be exposed is prevented from being dragged by the protection unit 22 and thus the substrate to be exposed is prevented from being scratched by the protection unit 22.

In an example, as shown in FIG. 3, the control module may comprise a motor 221 configured to drive the lifter 220 to move up or down in the vertical direction. The motor 221 may be connected directly or indirectly with the lifter 220.

In the mask device according to the embodiment of the present disclosure, the control module may be another functional module capable of controlling the lifter to move up or down in the vertical direction besides the motor, that is, any functional module capable of controlling the lifter to move up or down in the vertical direction falls within scopes of the present disclosure.

Figure 4:
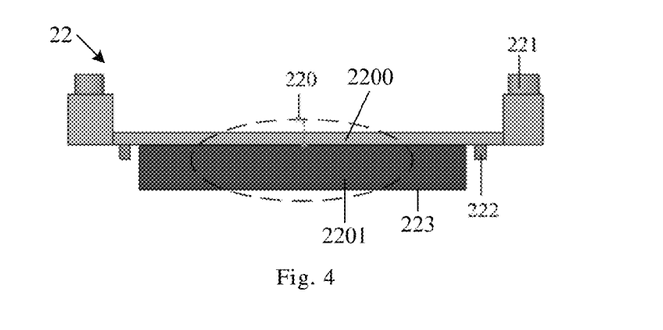
FIG. 4 is a schematic cross-sectional view of a protection unit according to another exemplary embodiment of the present disclosure.

FIG. 4 is a cross-sectional view of a protection unit 22 according to another exemplary embodiment of the present disclosure. The control module may further comprise a photoelectric sensor 222 configured to detect a spacing between the photoelectric sensor 222 and the upper surface of the substrate to be exposed, which spacing may be used to calculate the spacing between the lower end of the lifter 220 and the upper surface of the substrate to be exposed, as described below, such that the control module or other control device may control the lifter to move up or down in the vertical direction based on the spacing between the lower end of the lifter 220 and the upper surface of the substrate to be exposed, such that the lower end of the lifter 220 is lower than the lower surface of the mask. In an alternative example, the photoelectric sensor 222 may be configured to directly detect the spacing between the lower end of the lifter 220 and the upper surface of the substrate to be exposed.

In an embodiment of the present disclosure, the lower end of the lifter 220 may be configured as the lower end 223 of the protection unit 22. However, the present disclosure is not limited thereto, the lower end of the protection unit may be formed by other structure or part. In an example, the photoelectric sensor 222 may be connected with the lifter 220 or may be provided on the lifter 220, or may be provided at any suitable position for facilitating detection of the spacing between the lower end of the lifter 220 and the upper surface of the substrate to be exposed.

In one embodiment of the present disclosure, after the protection unit 22 is positioned, relative positions between the photoelectric sensor 222 and the lifter 220 are fixed, and preferably, a lower end of the photoelectric sensor 222 is higher than the lower end of the lifter 220. In an example, the photoelectric sensor 222 may be configured to detect the spacing between the photoelectric sensor 222 and the upper surface of the substrate to be exposed. Then, the spacing between the photoelectric sensor 222 and the upper surface of the substrate to be exposed and a preset spacing between the photoelectric sensor 222 and the lower end of the lifter 220 may be used to calculate the spacing between the lower end of the lifter 220 and the upper surface of the substrate to be exposed, thus the lifter can be controlled to move up or down in the vertical direction based on the calculation such that the lower end of the lifter 220 is lower than the lower surface of the mask.

Figure 10:
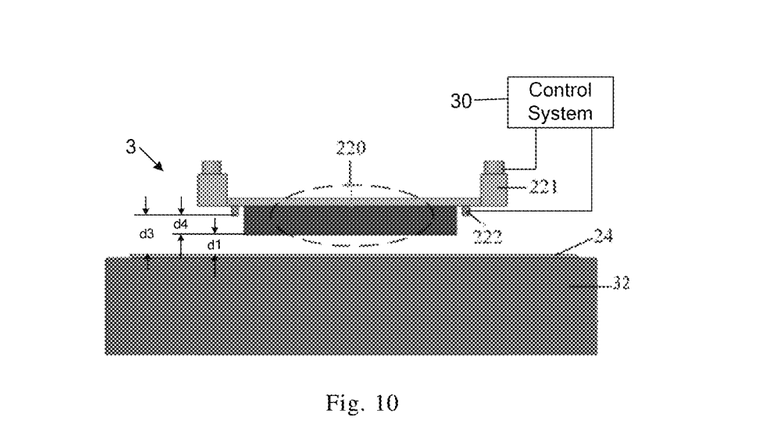
FIG. 10 is a structural schematic diagram of an exposure apparatus according to another exemplary embodiment of the present disclosure.

In an example, the spacing between the photoelectric sensor and the upper surface of the substrate to be exposed is a vertical distance d3 (specifically, as shown in FIG. 10) between the photoelectric sensor and the upper surface of the substrate to be exposed; the spacing between the photoelectric sensor and the lower end of the lifter is a vertical distance d4 (specifically, as shown in FIG. 10) between the photoelectric sensor and a horizontal extended plane of the lower end of the lifter). Here, spacings between the photoelectric sensor and other objects indicate spacings between the same position (e.g., a lower surface or center) of the photoelectric sensor and the other objects.

It is noted that, if a size of photoelectric sensor is very small, the size of the photoelectric sensor itself may be neglected in embodiments of the present disclosure. For example, a spacing between the center of the photoelectric sensor and the lower end of the lifter may be used as the spacing between the lower surface or other portions of the photoelectric sensor and the lower end of the lifter; correspondingly, a spacing between the center of the photoelectric sensor and the upper surface of the substrate to be exposed may be used as the spacing between the lower surface or other portions of the photoelectric sensor and the upper surface of the substrate to be exposed.

Figure 5:
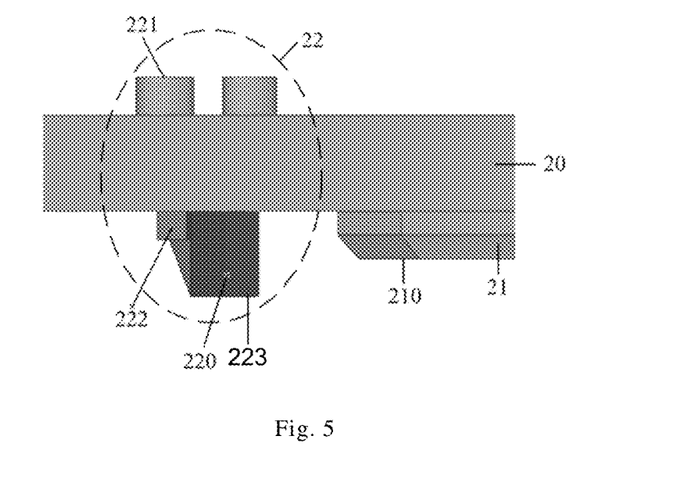
FIG. 5 is a partially enlarged view showing arrangement of a protection unit according to a further exemplary embodiment of the present disclosure.

FIG. 5 is a partially enlarged view showing arrangements of the protection unit 22 and the protection unit 22 on the mask carrier 20. The lower end 223 of the protection unit 22 (that is, the lower end of the lifter 220) is lower than the lower surface 210 of the mask 21, so that when the substrate to be exposed is moved during exposure, the possibility that the mask 21 is scratched by foreign matters on the substrate to be exposed is reduced.

Figure 6:
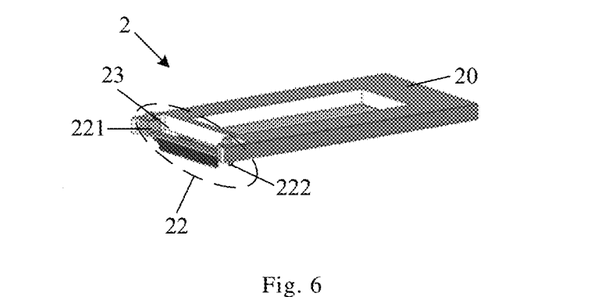
FIG. 6 is a schematic diagram showing arrangements of a mask device and a protection unit according to another exemplary embodiment of the present disclosure.

Preferably, as shown in FIG. 6, the mask carrier 20 is provided with an opening or a recess 23, the protection unit 22 is arranged within the opening or recess 23, and the motor 221 is fixed onto an inner wall of the opening or recess 23. In embodiments of the present disclosure, since the mask carrier 20 is provided with the opening or recess 23, and the protection unit 22 is arranged within the opening or recess 23, a space occupied by the protection unit 22 can be saved.

Preferably, as shown in FIG. 4, each said control module comprises two motors 221 which are provided at both ends of the corresponding lifter 220, respectively. In the embodiment of the present disclosure, through providing two motors at both ends of each lifter respectively, the lifter can be adjusted at both ends thereof at the same time, thus the lifter can be adjusted more accurately.

In an example, as shown in FIG. 4, the lifter 220 comprises a lifting carrier 2200 and a protrusion 2201 provided on a lower surface of the lifting carrier 2200. Preferably, each said control module comprises two photoelectric sensors 222, which are provided on the lower surface of the corresponding lifting carrier 2200 at two opposite sides of the protrusion 2201 respectively. In the embodiment of the present disclosure, since the two photoelectric sensors are provided on the lower surface of the lifting carrier at two opposite sides of the protrusion 2201 respectively, the spacing between the photoelectric sensor and the upper surface of the substrate to be exposed can be detected at the two sides of the lifter simultaneously, so that the spacing between the lower end of the lifter (that is, the lower end of the protrusion) and the upper surface of the substrate to be exposed can be calculated respectively at the two sides of the lifter, thus the lifter can be adjusted at the two sides of the lifter at the same time, and the lifter can be adjusted more accurately.

Figure 7:
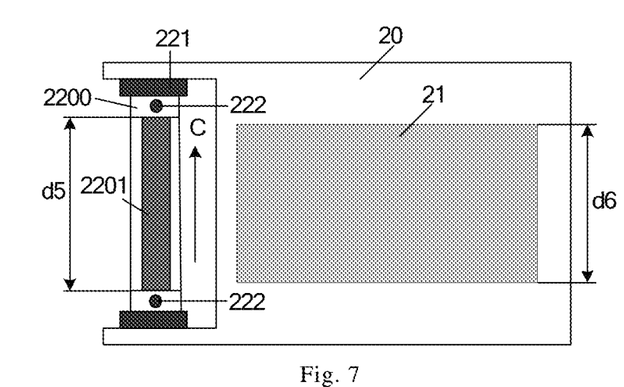
FIG. 7 is a schematic bottom view of a mask device according to a further exemplary embodiment of the present disclosure.

FIG. 7 is a bottom view of a mask device according to a further exemplary embodiment of the present disclosure, where a length of the protrusion 2201 in a first direction is larger than or equal to a length of the mask 21 in the first direction, wherein the first direction is a direction along which a connection line between the two photoelectric sensors 222 extends. As shown in FIG. 7, the first direction is a direction of the connection line between the two photoelectric sensors 222 and may be represented by C, the length of the protrusion 2201 in the first direction may be represented by d5, the length of the mask 21 in the first direction may be represented by d6, and d5 is larger than or equal to d6.

In embodiments of the present disclosure, the protrusion 2201 may have a wedge shape, a cuboid shape, a cube shape or the like.

Figure 8:
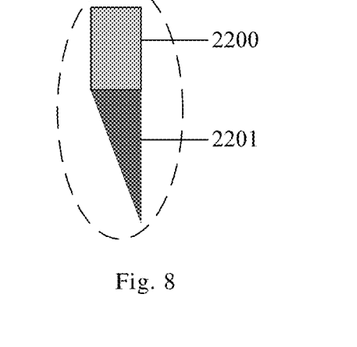
FIG. 8 is an enlarged view of a lifter according to one exemplary embodiment of the present disclosure.

FIG. 8 is an enlarged view showing the lifter 220 (comprising the lifting carrier 2200 and the protrusion 2201 provided on the lower surface of the lifting carrier 2200) according to an embodiment of the present disclosure. Preferably, in the embodiment of the present disclosure, the protrusion 2201 has a wedge shape. Providing the wedge-shaped protrusion 2201 may reduce an area of the lower end of the lifter 220 so as to reduce a contact area between the lower end of the lifter 220 and the upper surface of the substrate to be exposed, thereby the upper surface of the substrate to be exposed is prevented from being interfered by the lower end of the lifter 220 during exposure.

It is noted that, according to the embodiments of the present disclosure, the mask device 2 is described exemplarily by taking a mask carrier provided with one protection unit as an example; when the mask carrier is provided with a plurality of protection units, specific structures and arrangements of other protection units are the same as those of the protection unit exemplarily enumerated in the above embodiments, which will not be repeated herein.

Embodiments of the present disclosure provide a mask device comprising a mask carrier, a mask disposed on a lower surface of the mask carrier, and at least one protection unit provided on the mask carrier, wherein the protection unit is configured such that a lower end of the protection unit is lower than the lower surface of the mask during exposure. Since the mask carrier is provided with the protection unit, and the lower end of the protection unit is arranged to be lower than the lower surface of the mask, that is, the lower end of the protection unit is lower than the entire lower surface of the mask. Thus, during exposure, if there is a foreign matter on the substrate to be exposed, the lower end of the protection unit will provide a barrier for the foreign matter so that the foreign matter cannot contact the mask, and consequently, the possibility that the mask is scratched by the foreign matter on substrate to be exposed can be greatly reduced during exposure so that the mask is protected, thereby reducing a production cost of the semiconductor devices.

As shown in FIG. 9, embodiments of the present disclosure provide an exposure apparatus 3, the exposure apparatus 3 may comprise a mask device and an exposure workbench 32 configured to carry a substrate 24 to be exposed. In one example, the mask device may be the mask device 2 in the embodiments as described above, and may comprise the mask carrier 20, the mask 21 disposed on the lower surface of the mask carrier 20 and the protection unit 22 provided on the mask carrier 20, wherein the lower end of the protection unit 22 is arranged to be lower than the lower surface 210 of the mask 21. Specific structures or parts of the mask device 2 may be obtained with reference to the structural schematic diagram in any of the above FIG. 2 to FIG. 8.

In an example, as shown in FIG. 10, the exposure apparatus 3 may further comprise a controller or control system 30; in the condition of the protection unit 22 comprising the lifter 220, the motor 221 and the photoelectric sensor 222, the controller or control system 30 is configured to communicate with the motor 221 and the photoelectric sensor 222, to calculate the spacing between the lower end of the lifter 220 and the upper surface of the substrate 24 to be exposed according to the spacing between the photoelectric sensor 222 and the upper surface of the substrate 24 to be exposed detected by the photoelectric sensor 222 and a preset spacing between the photoelectric sensor 222 and the lower end of the lifter 220, and to control the motor 221 to drive the lifter 220 to move in the vertical direction according to the calculated spacing between the lower end of the lifter 220 and the upper surface of the substrate 24 to be exposed, such that the lower end of the lifter 220 is lower than the lower surface 210 of the mask 21.

In an alternative embodiment, the photoelectric sensor 222 may be configured to directly detect the spacing between the lower end of the lifter 220 and the upper surface of the substrate 24 to be exposed, and at this time, the controller or control system 30 may be configured to control the motor 221 to drive the lifter 220 to move in the vertical direction according to the spacing between the lower end of the lifter 220 and the upper surface of the substrate 24 to be exposed detected by the photoelectric sensor 222, such that the lower end of the lifter 220 is lower than the lower surface 210 of the mask 21.

In a further embodiment, when the spacing between the lower end of the lifter 220 and the upper surface of the substrate 24 to be exposed is smaller than or equal to 0, the control system controls the motor 221 to drive the lifter 220 to move upwards in the vertical direction until the spacing between the lower end of the lifter 220 and the upper surface of the substrate 24 to be exposed is larger than 0.

It would be appreciated that in embodiments of the present disclosure, if there is a foreign matter on the substrate 24 to be exposed, the spacing between the lower end of the lifter 220 and the upper surface of the substrate 24 to be exposed is a spacing between the lower end of the lifter 220 and an upper surface of the foreign matter on the substrate 24 to be exposed. In such a case, the spacing between the lower end of the lifter and the upper surface of the foreign matter on the substrate to be exposed is a vertical distance between the lower end of the lifter and the upper surface of the foreign matter on the substrate to be exposed.

Exemplarily, in embodiments of the present disclosure, as shown in FIG. 9 and FIG. 10, spacing between the lower end of the protection unit 22 and the upper surface of the substrate 24 to be exposed is the spacing between the lower end of the lifter 220 and the upper surface of the substrate 24 to be exposed. In the present disclosure, the photoelectric sensor 222 is used to detect in real time the spacing between the photoelectric sensor 222 and the upper surface of the substrate 24 to be exposed, and the controller or control system 30 is used to calculate the spacing between the lower end of the lifter 220 and the upper surface of the substrate 24 to be exposed, or the photoelectric sensor 222 is used to detect in real time the spacing between the lower end of the lifter 220 and the upper surface of the substrate 24 to be exposed, so that when the spacing between the lower end of the lifter 220 and the upper surface of the substrate 24 to be exposed is smaller than or equal to 0, the controller or control system 30 may control the motor 221 to drive the lifter 220 to move upwards in the vertical direction, until the spacing between the lower end of the lifter 220 and the upper surface of the substrate 24 to be exposed is larger than 0. As such, it can be ensured that, during exposure, if the lower end of the lifter 220 contacts the substrate 24 to be exposed or the foreign matter on the substrate 24 to be exposed, the substrate 24 to be exposed will not be scratched by the lifter 220 when the exposure workbench 32 is moved, thereby the substrate 24 to be exposed is protected.

It is noted that the controller or control system 30 shown in FIG. 10 is only an exemplary example. According to embodiments of the present disclosure, the controller or control system may be implemented by software which can be run in hardware such as a CPU (Central Processing Unit), a single-chip computer or other functional chips. Specifically, the controller or control system may be implemented by running software programs in hardware of the exposure apparatus, or may be implemented by providing separate hardware and by running software programs in the separate hardware, which are not particularly limited in the present disclosure.

In one embodiment of the present disclosure, the controller or control system 30 may be configured to adjust a stepping number of the motor 221 so as to drive the motor 221 to adjust the lifter 220 in the vertical direction.

Figure 11:
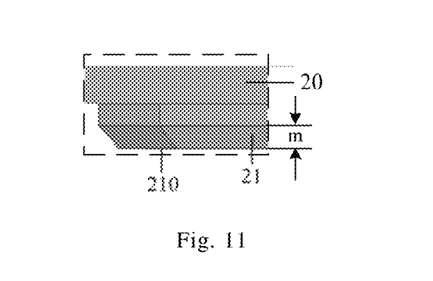
FIG. 11 is a partially enlarged view showing arrangement of a mask according to a further exemplary embodiment of the present disclosure.

Exemplarily, FIG. 11 is a partially enlarged view showing arrangement of the mask 21 on the mask carrier 20. As shown in FIG. 10 and FIG. 11, the controller or control system 30 may be further configured to: calculate a maximum drooping amount m of the mask 21; calculate the spacing between the lower surface 210 of the mask 21 and the upper surface of the substrate 24 to be exposed based on a preset exposure spacing between the lower surface 210 of the mask 21 and the upper surface of the substrate 24 to be exposed and the maximum drooping amount m of the mask 21; and control the motor 221 to drive the lifter 220 to move in the vertical direction when the spacing between the lower end of the lifter 220 and the upper surface of the substrate 24 to be exposed is larger than or equal to the spacing between the lower surface 210 of the mask 21 and the upper surface of the substrate 24 to be exposed, until the spacing between the lower end of the lifter 220 and the upper surface of the substrate 24 to be exposed becomes smaller than the spacing between the lower surface 210 of the mask 21 and the upper surface of the substrate 24 to be exposed. As such, if the control system 30 adjusts and moves the lifter 220 in the vertical direction upwards by an overlarge distance, which results in the spacing between the lower end of the lifter 220 and the upper surface of the substrate 24 to be exposed being larger than or equal to spacing between the lower surface 210 of the mask 21 and the upper surface of the substrate 24 to be exposed, the control system 30 may control the motor 221 to move the lifter 220 downwards in the vertical direction, until the spacing between the lower end of the lifter 220 and the upper surface of the substrate 24 to be exposed becomes smaller than spacing between the lower surface 210 of the mask 21 and the upper surface of the substrate 24 to be exposed, that is, the lower end of the lifter 220 is caused to be lower than the lower surface of the mask 21, in other words, the lower end of the lifter 220 is lower than the entire lower surface of the mask 21. Thus, during exposure, if there is a foreign matter on the substrate 24 to be exposed, the lower end of the lifter 220 will provide a barrier for the foreign matter so that the foreign matter cannot contact the mask 21, and consequently, the possibility that the mask 21 is scratched by the foreign matter on substrate 24 to be exposed can be greatly reduced when moving the exposure workbench 32 during exposure, so that the mask can be protected, thereby reducing a production cost of the semiconductor devices.

Here, a difference between the preset exposure spacing and the maximum drooping amount m of the mask is the spacing between the lower surface of the mask and the upper surface of the substrate to be exposed (and thus may be regarded as actual exposure spacing).

Exemplarily, the maximum drooping amount of the mask may be calculated from measurements from a grating. In an example, a grating may be provided on either side of the mask device at a position having the same height as the mask, and a light receiving unit is provided on the other side of the mask. Generally and theoretically, if the mask does not droop due to gravity, when light emitted from a light source passes through the grating and irradiates onto a side face of the mask, a vertical dimension of a projection area of the mask received by the light receiving unit is equal to the thickness of the mask that does not droop (i.e., in accordance with the projection principle). In practice, the mask will droop due to gravity, thus the projection area of the mask actually received by the light receiving unit will be larger than that of the mask theoretically received by the light receiving unit, and a difference between the projection area of the mask actually received by the light receiving unit and the projection area of the mask theoretically received by the light receiving unit is calculated by the control system, thereby the maximum drooping amount of the mask can be obtained.

Further, the grating is an optical device having a plurality of parallel slits of the same width and spacing. Light incident to the grating may be both interfered and diffracted by the grating so as to generate thin bright fringes, thereby wavelength of the light may be measured accurately.

Figure 12:
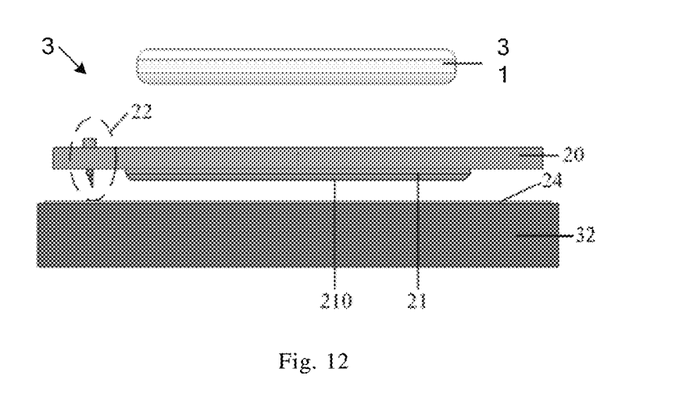
FIG. 12 is a structural schematic diagram of an exposure apparatus according to a further exemplary embodiment of the present disclosure.

As shown in FIG. 12, in embodiments of the present disclosure, the exposure apparatus 3 may further comprise an exposure light source 31. During exposure performed by the exposure apparatus 3, light emitted from the exposure light source 31 is transmitted through the mask to irradiate light onto the substrate to be exposed so that regions on the substrate to be exposed are exposed.

Embodiments of the present disclosure provide an exposure apparatus, comprising a mask device and an exposure workbench configured to carry a substrate to be exposed. The mask device comprises a mask carrier, a mask disposed on a lower surface of the mask carrier and at least one protection unit provided on the mask carrier, wherein the protection unit is configured such that a lower end of the protection unit is lower than the lower surface of the mask during exposure. Since the mask carrier is provided with the protection unit, and the lower end of the protection unit is arranged to be lower than the lower surface of the mask, that is, the lower end of the protection unit is lower than the entire lower surface of the mask. Thus, during exposure, if there is a foreign matter on the substrate to be exposed, the lower end of the protection unit will provide a barrier for the foreign matter so that the foreign matter cannot contact the mask, and consequently, the possibility that the mask is scratched by the foreign matter on substrate to be exposed can be greatly reduced during exposure, so that the mask is protected, thereby reducing a production cost of the semiconductor devices.

Figure 13:
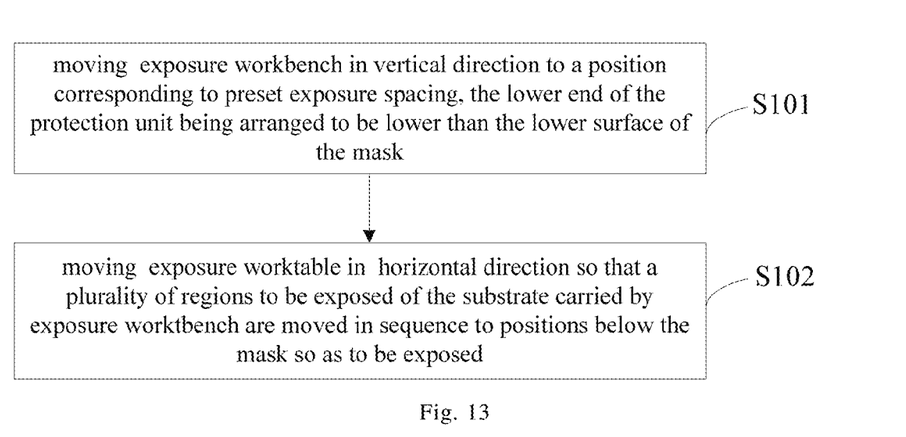
FIG. 13 is a flowchart of an exposure method according to one exemplary embodiment of the present disclosure.

As shown in FIG. 13, embodiments of the present disclosure further provides an exposure method, which may be a method of exposing a substrate by using the exposure apparatus 3 provided in embodiments of the present disclosure, the exposure apparatus 3 comprises the above mask device 2 provided in embodiments of the present disclosure and an exposure workbench 32 configured to carry a substrate 24 to be exposed, and the mask device 2 comprises the mask carrier 20, the mask 21 disposed on a lower surface of the mask carrier 20 and at least one protection unit 22 provided on the mask carrier 20. The exposure method may comprise:

step S101: moving the exposure workbench in a vertical direction to a position corresponding to a preset exposure spacing, wherein the lower end of the protection unit is arranged to be lower than the lower surface of the mask.

During exposure performed by the exposure apparatus provided in embodiments of the present disclosure, the exposure workbench may be firstly moved in the vertical direction to a position outside of the protection unit and corresponding to a preset exposure spacing, wherein the lower end of the protection unit provided on the mask carrier of the mask device of the exposure apparatus is lower than the lower surface of the mask, so that the possibility that the mask is scratched by the foreign matter on substrate to be exposed can be reduced when moving exposure workbench during exposure.

Herein, the preset exposure spacing is a preset spacing between the lower surface of the mask and the upper surface of the substrate to be exposed. It will be appreciated that, after the mask droops, the actual exposure spacing will be smaller than the preset exposure spacing.

After the exposure workbench is moved in the vertical direction to the position outside of the protection unit and corresponding to the preset exposure spacing, the exposure workbench may be moved to expose a first region to be exposed of the substrate carried on the exposure workbench. As shown in FIG. 13, the method further comprises:

step S102: moving the exposure workbench in a horizontal direction so that the exposure workbench is passed underneath the lower end of the protection unit and a plurality of regions to be exposed of the substrate carried by the exposure workbench are moved in sequence to positions below the mask so as to be exposed.

In embodiments of the present disclosure, after the first region of the substrate is exposed, the exposure workbench may be directly moved in the horizontal direction so that a second region to be exposed of the substrate carried on the exposure workbench is moved to a position below the mask so as to be exposed, and so on, thereby a plurality of regions to be exposed of the substrate carried by the exposure workbench are moved in sequence to positions below the mask so as to be exposed.

With the exposure method provided in the embodiment of the present disclosure, the exposure workbench is moved in the vertical direction to a position corresponding to the preset exposure spacing before the first region to be exposed of the substrate is exposed; since the exposure apparatus according to the embodiment of the present disclosure is provided with the protection unit for reducing the possibility that the mask is scratched by the foreign matter on substrate to be exposed, the exposure workbench may be directly moved in the horizontal direction after the first region of the substrate is exposed, so that other regions to be exposed of the substrate are exposed in sequence.

Figure 14:
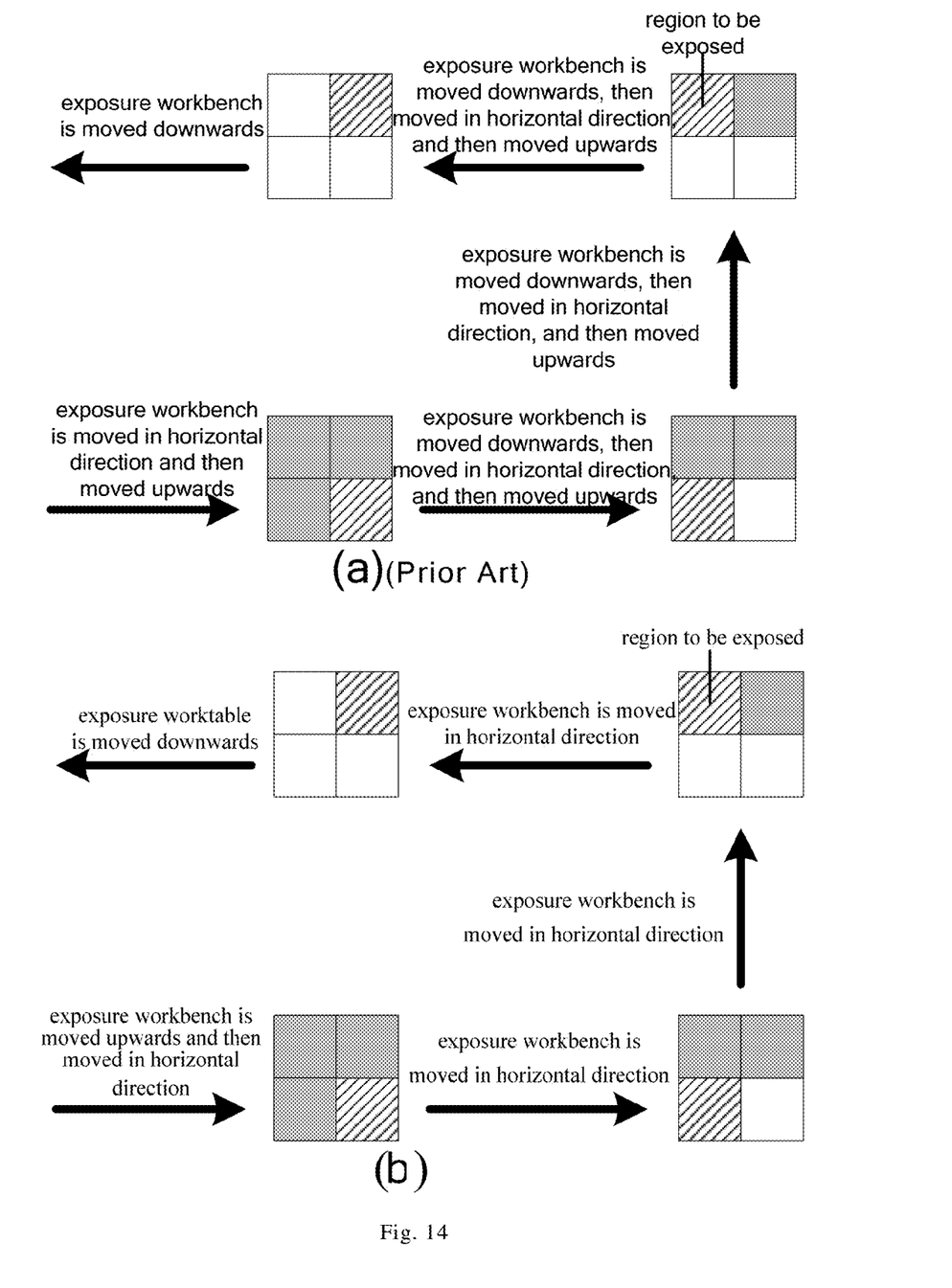
FIG. 14 is a schematic diagram showing a comparison between an exposure process in prior arts and an exposure process according to an embodiment of the present disclosure.

FIG. 14 is a schematic diagram showing a comparison between an exposure process of prior arts and an exposure process according to an embodiment of the present disclosure. As shown in part (a) in FIG. 14, in the exposure process of prior arts, every time one region to be exposed of the substrate has been exposed, to prevent the mask from being scratched by the foreign matter on the substrate to be exposed, the exposure workbench should be firstly moved downwards in the vertical direction, then in the horizontal direction until a next region to be exposed of the substrate is moved to a position below the mask, then the exposure workbench is moved in the vertical direction to a position corresponding to the preset exposure spacing to expose the region to be exposed, and so on, until exposures of a plurality of regions to be exposed of the substrate is finished. In the exposure process according to embodiments of the present disclosure, as shown in part (b) in FIG. 14, the exposure workbench is moved in the vertical direction to a position corresponding to the preset exposure spacing before a first region to be exposed of the substrate is exposed; since the exposure apparatus according to embodiments of the present disclosure is provided with the protection unit for the reducing the possibility that the mask is scratched by the foreign matter on substrate to be exposed, the exposure workbench may be directly moved in the horizontal direction after the first region of the substrate is exposed, and then a next region to be exposed of the substrate is exposed after it is moved to a position below the mask, and so on, until exposures of a plurality of regions to be exposed of the substrate is finished. As compared to prior arts, the exposure method according to embodiments of the present disclosure may save time for moving the exposure workbench in the vertical direction, so that the time for moving the exposure workbench is reduced, thereby saving exposure time and improving exposure capacity.

In this method, the spacing between the lower end of the protection unit and the upper surface of the substrate to be exposed may be obtained in real time, and the protection unit is controlled to move in the vertical direction according to the obtained spacing between the lower end of the protection unit and the upper surface of the substrate to be exposed, such that the lower end of the protection unit is lower than the lower surface of the mask.

In an exemplary embodiment, as described above, each said protection unit may comprise a lifter having a lower end which is the lower end of the protection unit, a motor configured to drive the lifter to move up or down in the vertical direction so as to adjust the spacing between the lower end and the upper surface of the substrate to be exposed, and a photoelectric sensor configured to detect a spacing between the photoelectric sensor and the upper surface of the substrate to be exposed, the above exposure method may further comprise:

step S103: detecting the spacing between the photoelectric sensor and the upper surface of the substrate to be exposed; and step S104: calculating the spacing between the lower end of the lifter and the upper surface of the substrate to be exposed according to the spacing between the photoelectric sensor and the upper surface of the substrate to be exposed and a preset spacing between the photoelectric sensor and the lower end of the lifter.

In an alternative embodiment, the method may further comprise detecting the spacing between the lower end of the lifter and the upper surface of the substrate to be exposed, and according to the detected spacing between the lower end of the lifter and the upper surface of the substrate to be exposed, controlling the motor to drive the lifter to move up or down or move in the vertical direction so that the lower end of the lifter is lower than the lower surface of the mask.

The method may further comprise a step S105 of controlling, when the spacing between the lower end of the lifter and the upper surface of the substrate to be exposed is smaller than or equal to 0, the motor to drive the lifter to move up or down or move in the vertical direction until the spacing between the lower end of the lifter and the upper surface of the substrate to be exposed is larger than 0.

With the exposure method according to embodiments of the present disclosure, the spacing between the lower end of the lifter and the upper surface of the substrate to be exposed is obtained in real time and the lifter is adjusted in real time, so that the spacing between the lower end of the lifter and the upper surface of the substrate to be exposed is larger than 0, thereby the possibility that the substrate to be exposed is scratched due to a foreign matter on the substrate to be exposed being dragged by the lower end of the lifter or the lower end of the lifter can be greatly reduced.

The exposure method according to embodiments of the present disclosure may further comprise:

step S106: detecting a maximum drooping amount of the mask;

step S107: calculating the spacing between the lower surface of the mask and the upper surface of the substrate to be exposed according to the exposure spacing and the maximum drooping amount of the mask;

wherein the way of detecting the maximum drooping amount of the mask has been described in detail in the above embodiment, and will not be repeated here; and step S108: controlling the motor to drive the lifter to move in the vertical direction when the spacing between the lower end of the lifter and the upper surface of the substrate to be exposed is larger than or equal to the spacing between the lower surface of the mask and the upper surface of the substrate to be exposed, until the spacing between the lower end of the lifter and the upper surface of the substrate to be exposed is smaller than the spacing between the lower surface of the mask and the upper surface of the substrate to be exposed.

With the exposure method according to embodiments of the present disclosure, the spacing between the lower end of the lifter and the upper surface of the substrate to be exposed is obtained in real time and the lifter is adjusted in real time, so that the spacing between the lower end of the lifter and the upper surface of the substrate to be exposed is smaller than the spacing between the lower surface of the mask and the upper surface of the substrate to be exposed (the lower end of the lifter is lower than the lower surface of the mask), thereby the possibility that the mask is scratched by the foreign matter on the substrate to be exposed when moving the exposure workbench can be greatly reduced during exposure.

It is noted that the steps S103 to S105 and S106 to S108 in embodiments of the present disclosure may be performed during performing the steps S101 to S102.

The embodiments of the present disclosure provide an exposure method, where the exposure workbench is moved in the vertical direction to a position corresponding to the preset exposure spacing before a first region to be exposed of the substrate is exposed by using the exposure method, and the exposure workbench may be directly moved in the horizontal direction after the first region of the substrate is exposed, then a next region to be exposed of the substrate is exposed after it is moved to a position below the mask, and so on, until exposures of a plurality of regions to be exposed of the substrate is finished. As compared to prior arts, the exposure method according to embodiments of the present disclosure may save time for moving the exposure workbench in the vertical direction may be saved, so that the time for moving the exposure workbench is reduced, thereby saving exposure time and improving exposure capacity.

Meanwhile, the spacing between the lower end of the lifter and the upper surface of the substrate to be exposed is obtained in real time and the lifter is adjusted in real time, so it can be ensured that the spacing between the lower end of the lifter and the upper surface of the substrate to be exposed is larger than 0 and smaller than the spacing between the lower surface of the mask and the upper surface of the substrate to be exposed, thereby the possibility that the mask is scratched by the foreign matter on the substrate to be exposed when moving the exposure workbench can be greatly reduced during exposure, and the substrate to be exposed is prevented from being scratched by the lifter or the foreign matter dragged by the lifter during exposure.

The mask device, the exposure apparatus and the exposure method provided according to the embodiments of the present disclosure may be used to manufacture semiconductor devices such as a liquid crystal display device, which may be a liquid crystal display, a liquid crystal TV, a digital photo frame, a mobile phone, a tablet computer or any other product or member having a display function.

The above described contents are only exemplary embodiments of the present disclosure, and the scope of the present disclosure is not limited thereto. Any changes or modifications obviously made by those skilled in the art based on the technology disclosed in the present invention should fall within the scope of the present invention. Thus, the scope of the present invention should be determined by the claims and their equivalents.

What is claimed is:

1. A mask device, comprising a mask carrier and a mask disposed on a lower surface of the mask carrier,
   wherein the mask device further comprises at least one protection unit provided on the mask carrier,
   wherein a lower end of the at least one protection unit is arranged to be lower than a lower surface of the mask during exposure, and
   wherein:
   each of said protection unit comprises a lifter and a control module configured to control the lifter to move up or down in a vertical direction so as to adjust a spacing between the lower end and an upper surface of the substrate to be exposed, such that the spacing between the lower end and the upper surface of the substrate to be exposed is smaller than a spacing between the lower surface of the mask and the upper surface of the substrate to be exposed,
   the control module comprises a motor configured to drive the lifter to move up or down in the vertical direction,
   the mask carrier is provided with an opening,
   the protection unit is arranged within the opening, and
   the motor is fixed onto an inner wall of the opening.

2. The mask device according to claim 1, wherein
   the control module further comprises a photoelectric sensor,
   the photoelectric sensor is configured to detect a spacing between the photoelectric sensor and the upper surface of the substrate to be exposed, which is used to calculate the spacing between a lower end of the lifter and the upper surface of the substrate to be exposed, or the photoelectric sensor is configured to detect the spacing between the lower end of the lifter and the upper surface of the substrate to be exposed, and the motor is configured to drive the lifter to move up or down in the vertical direction according to the spacing between the lower end of the lifter and the upper surface of the substrate to be exposed, such that the lower end of the lifter is lower than the lower surface of the mask, and the lower end of the lifter is the lower end of the protection unit.

3. The mask device according to claim 1, wherein each control module comprises two said motors which are disposed at two horizontal end sides of a corresponding lifter, respectively.

4. The mask device according to claim 2, wherein
the lifter comprises a lifting carrier and a protrusion provided on a lower surface of the lifting carrier,
each said control module comprises two said photoelectric sensors, which are provided on the lower surface of the lifting carrier and at two horizontal end sides of the protrusion, respectively.

5. The mask device according to claim 4, wherein a length of the protrusion in a first direction is larger than or equal to a length of the mask in the first direction, wherein the first direction is a direction along which a connection line between the two photoelectric sensors extends.

6. The mask device according to claim 4, wherein the protrusion has a wedge shape.

7. An exposure apparatus, comprising the mask device according to claim 1 and an exposure workbench configured to carry a substrate to be exposed.

8. The exposure apparatus according to claim 7, wherein the exposure apparatus further comprises a control system, each said protection unit comprises a lifter having a lower end which is the lower end of the protection unit, a motor configured to drive the lifter to move up or down in a vertical direction so as to adjust a spacing between the lower end of the lifter and an upper surface of the substrate to be exposed, and a photoelectric sensor configured to detect a spacing between the photoelectric sensor and the upper surface of the substrate to be exposed, and the control system is configured to calculate the spacing between the lower end of the lifter and the upper surface of the substrate to be exposed according to the spacing between the photoelectric sensor and the upper surface of the substrate to be exposed detected by the photoelectric sensor and a preset spacing between the photoelectric sensor and the lower end of the lifter, and to control the motor to drive the lifter to move in the vertical direction according to the calculated spacing between the lower end of the lifter and the upper surface of the substrate to be exposed, such that the lower end of the lifter is lower than the lower surface of the mask.

9. The exposure apparatus according to claim 7, wherein the exposure apparatus further comprises a control system, each said protection unit comprises a lifter having a lower end which is the lower end of the protection unit, a motor configured to control the lifter to move up or down in a vertical direction so as to adjust a spacing between the lower end of the lifter and an upper surface of the substrate to be exposed, and a photoelectric sensor configured to detect the spacing between the lower end of the lifter and the upper surface of the substrate to be exposed, and the control system is configured to, control the motor to drive the lifter to move in the vertical direction according to the spacing between the lower end of the lifter and the upper surface of the substrate to be exposed detected by the photoelectric sensor, such that the lower end of the lifter is lower than the lower surface of the mask.

10. The exposure apparatus according to claim 8, wherein the control system is further configured to control the motor to drive the lifter to move in the vertical direction when the spacing between the lower end of the lifter and the upper surface of the substrate to be exposed is smaller than or equal to 0, until the spacing between the lower end of the lifter and the upper surface of the substrate to be exposed is larger than 0.

11. The exposure apparatus according to claim 8, wherein the control system is further configured to calculate a maximum drooping amount of the mask,
calculate a spacing between the lower surface of the mask and the upper surface of the substrate to be exposed according to a preset exposure spacing between the lower surface of the mask and the upper surface of the substrate to be exposed and the maximum drooping amount of the mask, and
control the motor to drive the lifter to move in the vertical direction when the spacing between the lower end of the lifter and the upper surface of the substrate to be exposed is larger than or equal to the spacing between the lower surface of the mask and the upper surface of the substrate to be exposed, until the spacing between the lower end of the lifter and the upper surface of the substrate to be exposed becomes smaller than the spacing between the lower surface of the mask and the upper surface of the substrate to be exposed.

12. A method of exposing a substrate by using the exposure apparatus according to claim 7, comprising:

moving the exposure workbench in the vertical direction to a position corresponding to a preset exposure spacing, the preset exposure spacing being a preset spacing between the lower surface of the mask and an upper surface of the substrate to be exposed, wherein the lower end of the protection unit is arranged to be lower than the lower surface of the mask;

driving, by the motor fixed onto the inner wall of the opening, the lifter of the protection unit arranged within the opening to move up or down in the vertical direction so as to adjust a spacing between the lower end and an upper surface of a substrate to be exposed, such that the spacing between the lower end and the upper surface of the substrate to be exposed is smaller than the spacing between the lower surface of the mask and the upper surface of the substrate to be exposed; and moving the exposure workbench in a horizontal direction so that a plurality of regions to be exposed of the substrate carried by the exposure workbench are moved in sequence to positions below the mask so as to be exposed.

13. The method according to claim 12, further comprising:

obtaining a spacing between the lower end of the protection unit and the upper surface of the substrate to be exposed; and
controlling the protection unit to move in the vertical direction according to the obtained spacing between the lower end of the protection unit and the upper surface of the substrate to be exposed, such that the lower end of the protection unit is lower than the lower surface of the mask.

14. The method according to claim 13, wherein the lifter has a lower end which is the lower end of the protection unit, the motor is configured to drive the lifter to move up or down in the vertical direction so as to adjust the spacing between the lower end and the upper surface of the substrate to be exposed, and each said protection unit further comprises a photoelectric sensor configured to detect a spacing between the photoelectric sensor and the upper surface of the substrate to be exposed, and the method further comprises:

detecting the spacing between the photoelectric sensor and the upper surface of the substrate to be exposed;

calculating the spacing between the lower end of the lifter and the upper surface of the substrate to be exposed according to the detected spacing between the photoelectric sensor and the upper surface of the substrate to be exposed and a preset spacing between the photoelectric sensor and the lower end of the lifter; and controlling the motor to drive the lifter to move in the vertical direction according to the calculated spacing between the lower end of the lifter and the upper surface of the substrate to be exposed, such that the lower end of the lifter is lower than the lower surface of the mask.

15. The method according to claim 13, wherein the lifter has a lower end which is the lower end of the protection unit, and the motor is configured to drive the lifter to move up or down in the vertical direction so as to adjust the spacing between the lower end and the upper surface of the substrate to be exposed; and the method further comprises:

detecting the spacing between the lower end of the lifter and the upper surface of the substrate to be exposed; and controlling the motor to drive the lifter to move in the vertical direction according to the detected spacing between the lower end of the lifter and the upper surface of the substrate to be exposed, such that the lower end of the lifter is lower than the lower surface of the mask.

16. The method according to claim 14, further comprising:

controlling the motor to drive the lifter to move in the vertical direction when the spacing between the lower end of the lifter and the upper surface of the substrate to be exposed is smaller than or equal to 0, until the spacing between the lower end of the lifter and the upper surface of the substrate to be exposed is larger than 0.

17. The method according to claim 14, further comprising:

detecting a maximum drooping amount of the mask;

calculating the spacing between the lower surface of the mask and the upper surface of the substrate to be exposed according to the preset exposure spacing and the maximum drooping amount of the mask; and controlling the motor to drive the lifter to move in the vertical direction when the spacing between the lower end of the lifter and the upper surface of the substrate to be exposed is larger than or equal to the spacing between the lower surface of the mask and the upper surface of the substrate to be exposed, until the spacing between the lower end of the lifter and the upper surface of the substrate to be exposed is smaller than the spacing between the lower surface of the mask and the upper surface of the substrate to be exposed.

* * * * *